United States Patent
Hong (10) Patent No.: US 8,697,575 B2
(45) Date of Patent: Apr. 15, 2014

(54) SEMICONDUCTOR DEVICE AND MANUFACTURING METHOD THEREOF

(75) Inventor: Zhongshan Hong, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 57 days.

(21) Appl. No.: 13/307,766

(22) Filed: Nov. 30, 2011

(65) Prior Publication Data
US 2012/0326320 A1   Dec. 27, 2012

(30) Foreign Application Priority Data
Jun. 27, 2011   (CN) .......................... 2011 1 0173874

(51) Int. Cl.
  *H01L 21/44*   (2006.01)
(52) U.S. Cl.
  USPC .................... 438/672; 438/675; 257/E21.577
(58) Field of Classification Search
  USPC .................... 438/672, 675; 257/E21.577
  See application file for complete search history.

(56) References Cited

U.S. PATENT DOCUMENTS

| | | | | |
|---|---|---|---|---|
| 8,338,958 B2* | 12/2012 | Nishio et al. | .................. | 257/774 |
| 2001/0035551 A1* | 11/2001 | Kotecki et al. | .................. | 257/306 |
| 2005/0110062 A1* | 5/2005 | Natori et al. | .................. | 257/295 |
| 2006/0038300 A1* | 2/2006 | Tanida et al. | .................. | 257/773 |
| 2010/0093169 A1* | 4/2010 | Kuo | .............................. | 438/667 |
| 2012/0326328 A1* | 12/2012 | Li et al. | .......................... | 257/774 |

* cited by examiner

*Primary Examiner* — Lex Malsawma
(74) *Attorney, Agent, or Firm* — Koppel, Patrick, Heybl & Philpott; Michael J. Ram (57) ABSTRACT

The present invention relates to a semiconductor device and the manufacturing method thereof. First, a hole is formed on a first side of a substrate. Then, an isolation layer is formed on an inner side of the hole and the hole is filled with a semiconductor material. Next, functional structures are formed on the first side of the substrate, the substrate is thinned from its second side opposite to the first side to expose the semiconductor material in the hole, and then the semiconductor material in the hole is removed to form a through hole penetrating through the substrate. The through hole is filled with a conductive material, thereby obtaining a final through substrate via (TSV) for facilitating electrical connection between different chips. By using a semiconductor material as TSV dummy material before filling the TSV with metal, the method can be better compatible with the standard process flow.

16 Claims, 10 Drawing Sheets

SEMICONDUCTOR DEVICE AND MANUFACTURING METHOD THEREOF

CROSS-REFERENCE TO RELATED APPLICATIONS

This application claims priority to Chinese Patent Application No. 201110173874.3, filed on Jun. 27, 2011 and entitled "Semiconductor Device and Manufacturing Method thereof", which is incorporated herein in its entirety by reference.

BACKGROUND OF THE INVENTION

1. Field of the Invention

The present invention relates to the semiconductor field, and more specifically relates to a semiconductor device and a method for manufacturing a semiconductor device.

2. Description of the Related Art

With the increasing development of semiconductor techniques, further improvement in packaging technology of semiconductor integrated device is demanded. Through Substrate Via (TSV) technology is a new packaging technology used for packaging different chips together, in which a via through the substrate and filled with a conductive material is formed, and then a plurality of chips or wafers are bonded together in a stacked manner thereby achieving an electrical connection between chips by using the via. TSV technology can combine chips of different functions together, increase the stacking density of chips in a three-dimensional direction, reduce the product size of an integrated circuit (IC), and significantly improve the operating speed and reduce the power consumption of chips.

TSV process can be integrated into different stages of the manufacturing process.

One common scheme is that the TSV process is performed before the formation of a functional structure (e.g., metal oxide semiconductor (MOS) transistor) on the substrate. For example, before forming the functional structure, a hole is formed by etching from a side of the substrate on which the functional structure is to be formed, and then the hole is filled with a conductive material. Then the functional structure is formed on the substrate; before stacking chips or wafers, the substrate is thinned such that the hole penetrates there through, thereby obtaining a via that penetrates through the substrate and is filled with the conductive material. However, if the TSV is filled with metal, contamination usually occurs on the substrate which makes a great impact on the subsequent process. Besides, the metal filling the hole cannot endure the high temperature during the formation of the functional structure, such as the high temperature for conducting a thermal oxidation process for forming a gate dielectric layer, or the high temperature for conducting a source/drain region activation process. On the other hand, if the TSV is filled with poly-silicon, the conductive performance of the TSV will deteriorate due to the high resistance of the poly-silicon.

The TSV process can also be performed in other stages. For example, the TSV process can start after the formation of the functional structure (such as MOS transistor) but before the back-end-of-line (BEOL) process (such as an interconnect process). Nevertheless, in this scheme, after the hole is filled with the conductive material, difficulty in the chemical mechanical polishing (CMP) process exists because the functional structure has been formed on the substrate. In another example, the TSV process can be performed after the BEOL process but before the bonding of the wafers. However, in this scheme, the area of the wafer usually has to be increased, so as to keep sufficient space for the TSV process after the interconnect process, and the complexity of the interconnect process is also raised. In yet another example, the TSV process can be performed after the bonding of the wafers. However, the disadvantage brought in by this scheme is that the bonding material utilized for bonding the wafers is usually damaged due to the inability to bear the high temperature during the TSV process, so that the wafers cannot be bonded together.

A TSV process is disclosed in US patent application publication No. 2010/0093169A1, which is titled "Through Substrate Via Process" and published on Apr. 15, 2010. In this disclosure, before forming a functional structure on a first side of a substrate, a hole is formed at the first side with a layer of a first dielectric material formed on a sidewall and a bottom of the hole as an isolation layer and is filled with a second dielectric material, wherein the first dielectric material and the second dielectric material are different from each other and can respectively be one of silicon oxide and silicon nitride. Then the functional structure is formed on the substrate; thereafter, the substrate is thinned from the backside (opposite to the first side) of the substrate to expose the second dielectric material in the hole, the second dielectric material in the hole is removed, and then the hole is filled with a metal (e.g. copper), so as to obtain a final TSV with metal filled therein. In this scheme, before forming the functional structure, the material filling the hole of the substrate is a dielectric material like silicon oxide or silicon nitride instead of a metal, which is not damaged by will not contaminate the substrate. In addition, the above-mentioned problems in the case when the TSV process is performed after the formation of the functional structure can be avoided.

For the convenience of discussion, in the following description, the material that temporarily fills the hole before filling the hole with the final TSV filling material (e.g., copper) during the TSV fabrication is referred to as the "TSV dummy material".

SUMMARY OF THE INVENTION

The inventor of the present invention has found that, in the scheme disclosed in the aforementioned US patent application publication No. 2010/0093169A1, the material used as TSV dummy material is a material like silicon oxide or silicon nitride. For such material, a compatibility problem may appear in subsequent processes for manufacturing the functional structure and the like. For example, during the formation of the TSV, as well as during the subsequent processes such as shallow trench isolation (STI), local oxidation of silicon (LOCOS) and formation of self-aligned contact structure, silicon nitride or silicon oxide is usually used as a hard mask layer and/or a barrier layer. Thus, the TSV dummy material filling the hole in the substrate is easily damaged when removing the silicon nitride or silicon oxide that serves as the hard mask layer and/or the barrier layer. For example, hot phosphoric acid is usually used in wet etching when removing the silicon nitride hard mask layer during the STI process, which may damage the TSV dummy material and consequently adversely impacts the subsequent processes.

In addition, when the TSV dummy material is silicon oxide or silicon nitride, acid (such as phosphoric acid) is usually used in wet etching to remove the TSV dummy material in the hole. However, using acid to conduct wet etching may easily damage the metal contact on the TSV.

Therefore, provided herein is a new technical solution for forming a TSV, which can address at least one of the above problems existing in the prior art.

According to a first aspect of the invention, a method for manufacturing a semiconductor device is provided, comprising: forming a hole at a first side of a substrate; forming an isolation layer on an inner side of the hole; filling the hole with a semiconductor material; forming one or more functional structures on the first side of the substrate; thinning the substrate from a second side opposite to the first side of the substrate, so as to expose the semiconductor material in the hole; removing the semiconductor material to form a through hole penetrating through the substrate; and filling the through hole with a conductive material.

Optionally, forming one or more functional structures on the first side of the substrate comprises forming a compound formed of the semiconductor material on the semiconductor material and a metal.

Optionally, the metal is nickel, cobalt, or titanium.

Optionally, the semiconductor material is silicon, germanium, or SiGe.

Optionally, the semiconductor material is poly-silicon.

Optionally, the semiconductor material is n-type or p-type doped silicon.

Optionally, the method further comprises, before forming the hole at the first side of a substrate, forming a pad oxide layer and a silicon nitride layer in turn on the first side.

Optionally, forming the isolation layer comprises performing an oxidation process to form an oxide isolation layer on an inner side of the hole.

Optionally, filling the hole with the semiconductor material comprises: depositing the semiconductor material in the hole and on the silicon nitride layer; performing a chemical mechanical polishing (CMP) so as to expose the silicon nitride layer; and removing the silicon nitride layer and the pad oxide layer.

Optionally, the hole has a depth ranging from 5 μm to 40 μm.

Optionally, the isolation layer has a thickness ranging from 50 Å to 2000 Å.

Optionally, the conductive material is copper.

Optionally, the functional structures comprise a MOS transistor.

Optionally, removing the semiconductor material comprises using an isotropic etching process.

Optionally, the semiconductor material is removed by dry etching using a fluorine-contained gas.

Optionally, the semiconductor material is removed by wet etching using an alkaline solution.

Optionally, the alkaline solution is concentrated ammonia solution, KOH solution, or tetramethylammonium hydroxide (TMAH) solution.

According to a second aspect of the invention, a semiconductor device is provided, comprising: a substrate having a first side with one or more functional structures formed thereon and a second side opposite to the first side; and a via penetrating through the substrate, the via having an isolation layer formed on its inner side and being filled with a semiconductor material, wherein a compound formed of the semiconductor material and a metal is formed at an end of the via that is close to the first side.

According to a second aspect of the invention, a semiconductor device is provided, comprising: a substrate having a first side with one or more functional structures formed thereon and a second side opposite to the first side; and a via penetrating through the substrate, the via having an isolation layer formed on its inner side and being filled with a conductive material, wherein a compound formed of a semiconductor material and a metal is formed at an end of the via that is close to the first side.

Optionally, the semiconductor material is silicon, germanium, or SiGe.

Optionally, the metal is nickel, cobalt, or titanium.

Optionally, the conductive material is copper.

An advantage of the present invention is that, TSV dummy material can be prevented from damage during subsequent processes.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

With reference to the attached drawings, the present invention can be more clearly understood based on the following detailed description.

DESCRIPTION OF THE EMBODIMENTS

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

Meanwhile, it should be understood that, for the convenience of description, each component shown in the attached drawings is not drawn according to its actual size proportional relation.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

A method for manufacturing a semiconductor device according to an embodiment of the present invention will be described with reference to FIGS. 1A-1G, which includes a TSV formation process.

Figure 1A:
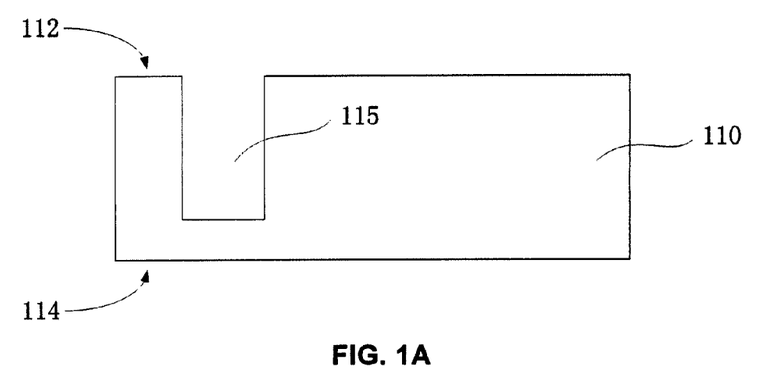
FIGS. 1A-1G are schematic cross-sectional views showing corresponding structures in each step of a method for manufacturing a semiconductor device according to an embodiment of the present invention.

As shown in FIG. 1A, a substrate 110 has a first side 112 and a second side 114 opposite to the first side 112. Firstly, a hole 115 is formed at the first side 112 of the substrate 110. The substrate 110 can be formed of any suitable semiconductor material, including but not limited to, silicon, germanium, SiGe, or the like. The hole 115 can be formed by any suitable process, such as photolithography and etching process. Note that, although only one hole 115 is shown in FIG. 1A, there can be a plurality of holes 115, the number and arrangement of which can be designed according to actual needs. The hole 115 has a depth that varies according to practical needs. Preferably, the hole 115 has a depth ranging from 5 μm to 40 μm.

Figure 1B:
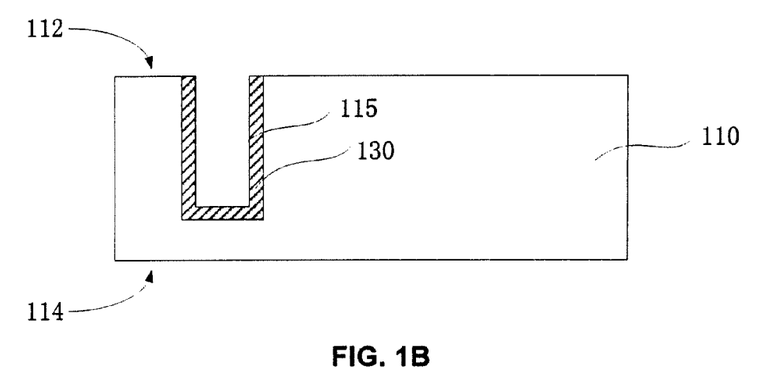

Then, as shown in FIG. 1B, the hole 115 has an isolation layer 130 formed on its inner side. The isolation layer 130 covers the bottom and the sidewall of the hole 115 and thus isolates the substrate from the material that is to be filled in the hole such that they will not be electrically connected. The isolation layer 130 can be of any suitable material, such as silicon oxide or silicon nitride. The isolation layer 130 can be formed by, for example, oxidation, deposition or any suitable process. The isolation layer 130 has a thickness that varies according to practical needs. Preferably, the isolation layer 130 has a thickness ranging from 50 Å to 2000 Å.

Figure 1C:
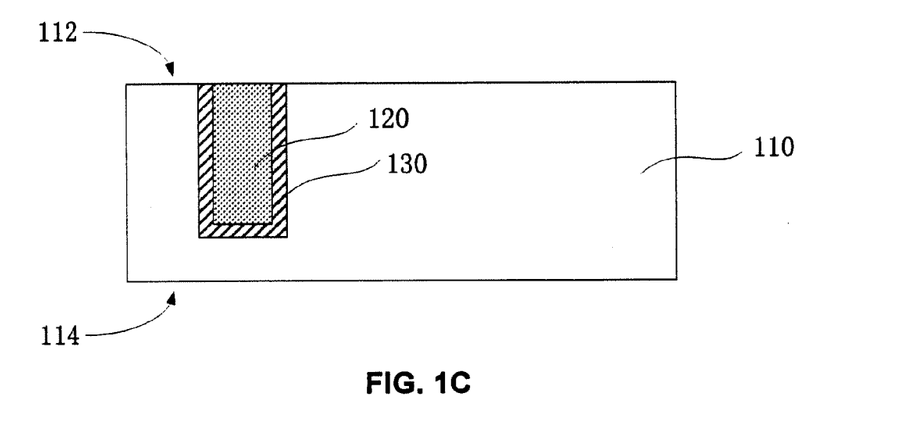

Next, as shown in FIG. 1C, the hole 115 with the isolation layer 130 formed therein is filled with a semiconductor material, thereby obtaining a filler 120 of the semiconductor material. The semiconductor material is used as a TSV dummy material for filling the hole 115. The filling can be conducted through various suitable methods. For example, the filler 120 can be obtained by depositing the semiconductor material on the first side 112 of the substrate and then performing chemical mechanical polishing (CMP). The filling semiconductor material can be silicon (e.g., can be mono-silicon or poly-silicon, can be undoped, n-type doped or p-type doped), germanium, SiGe or any other suitable semiconductor material. Since the filling material is a semiconductor material, the material of the filler 120 is different from the materials used in a hard mask layer or a barrier layer in subsequent processes such as shallow trench isolation (STI), local oxidation of silicon (LOCOS), and formation of self-aligned contact structures, and thus will not easily be damaged during the subsequent processes.

Figure 1D:
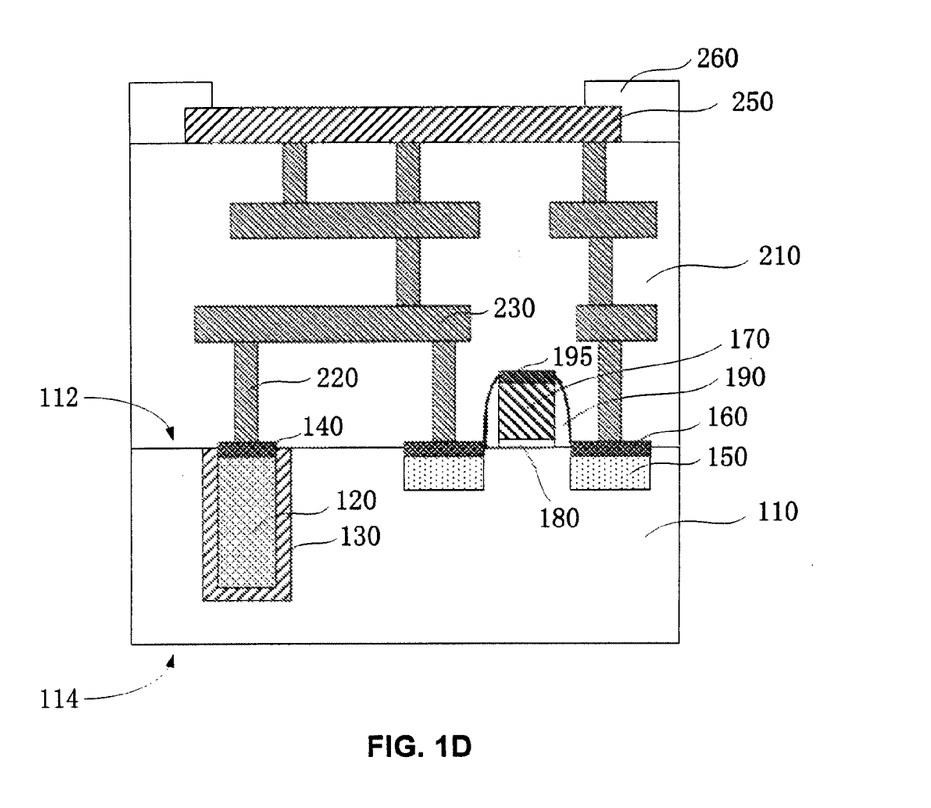

Next, as shown in FIG. 1D, various functional structures are formed on the first side 112 of the substrate 110. Herein, a functional structure means a structure that can be formed on the substrate and have certain functionality, such as an interlayer dielectric layer, a metal oxide semiconductor (MOS) transistor, metal plugs, metal interconnects, a passivation layer, or the like. The process for forming functional structures on the substrate is well-known and thus detailed descriptions thereof are not described here. FIG. 1D schematically shows some functional structures, including a dielectric layer 210 (which can include a plurality of interlayer dielectric layers that are not shown respectively herein), source/drain regions 150, source/drain region contacts 160 (which can be metal silicide, e.g., $TiSi_2$), a gate oxide layer 180, a gate 170, gate sidewall spacers 190, a gate contact 195, metal plugs 220, metal interconnects 230, a pad 250, a passivation layer 260, and the like. The source/drain regions 150, the gate oxide layer 180, the gate 170 and the gate sidewall spacers 190 can constitute a MOS transistor. One of ordinary skill in the relevant art will appreciate that, not all the functional structures shown in FIG. 1D are necessary. The functional structures on the substrate can be either more or less than, or even totally different from those shown in FIG. 1D. Moreover, the particular configurations and arrangements of various functional structures are not limited to those shown in FIG. 1D but can be different there from.

Optionally, during the process of forming a functional structure on the first side 112 of the substrate 110, a compound 140 of a metal and the semiconductor material of the filler 120 can be formed on the filler 120. The metal forming the compound 140 can be nickel, cobalt, titanium or other suitable metals. If the material of the filler 120 is silicon, then the compound 140 is a metal silicide. The compound 140 can additionally protect the filler 120 during the formation of the functional structures.

The compound 140 can be formed in an individual step or together with the formation of the source/drain contacts 160. For the latter situation, for example, after forming the source/drain regions 150, a metal can be deposited on the first side 112 of the substrate 110 and then annealing is conducted, such that the semiconductor material in the upper portion of the filler 120 and the metal react with each other, thereby generating the compound 140. The metal may also react with the silicon in the source/drain regions 150 to generate a metal silicide, thereby forming the source/drain contacts 160. In addition, when the gate 170 is a poly-silicon gate, the metal may also react with the silicon in the upper portion of the gate 170 to generate a metal silicide, thereby forming the gate contact 195.

Figure 1E:
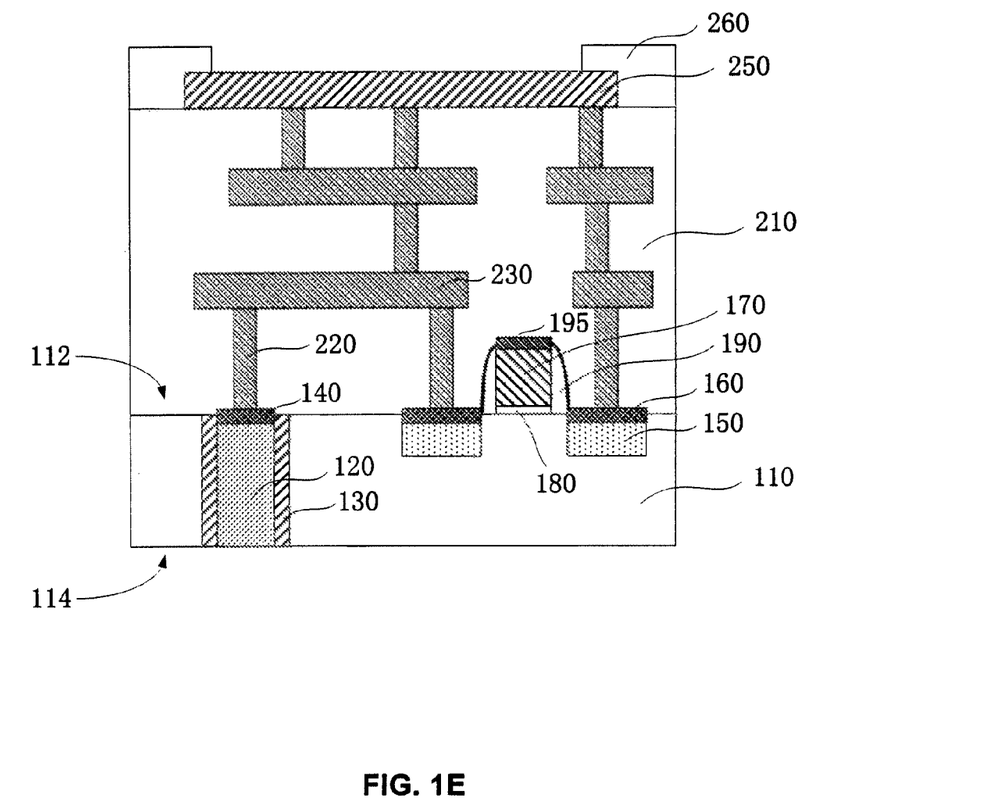

Next, as shown in FIG. 1E, the substrate 110 is thinned from the second side 114 of the substrate 110 to expose the semiconductor material in the hole 115, that is, to expose the filler 120. Since the process for thinning a substrate is well-known in the art, the details thereof are not described here. The extent of thinning can be determined according to practical needs. For example, the substrate 110 can be thinned until the filler 120 is exposed. Alternatively, after exposing the filler 120, the thinning substrate 110 can be continued until a desired substrate thickness is obtained.

Figure 1F:
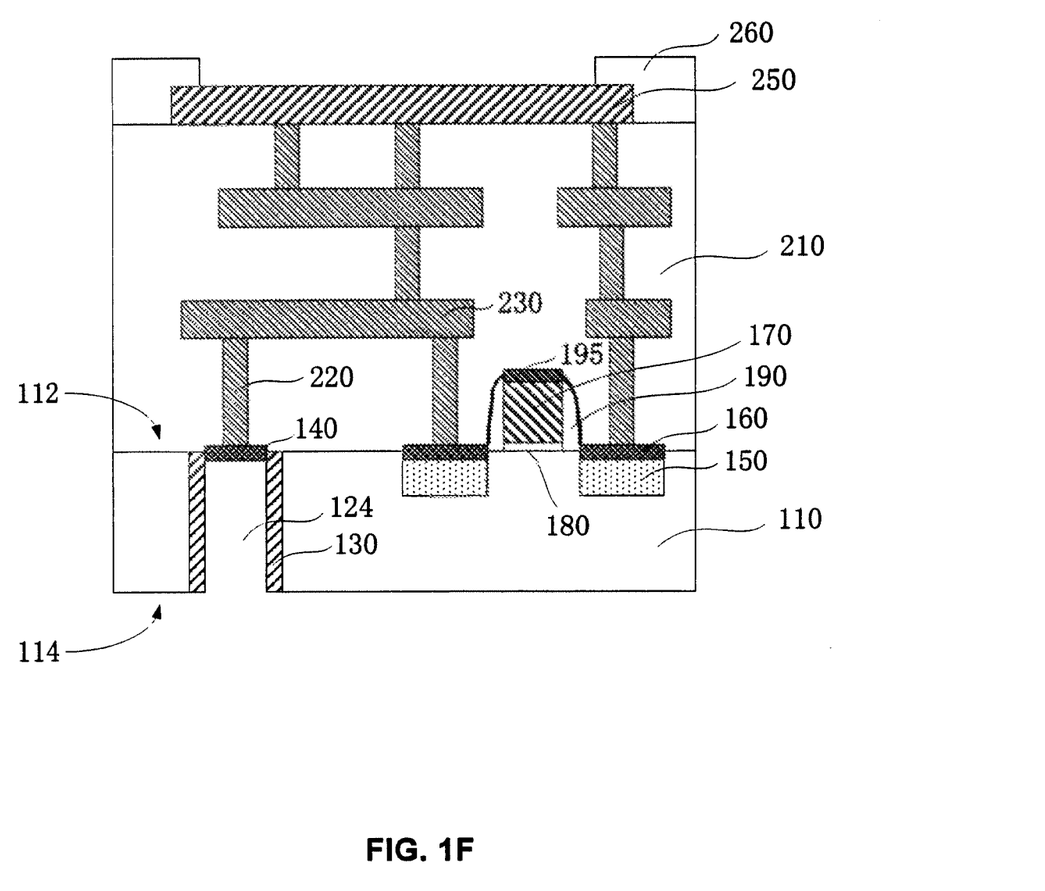

Then, as shown in FIG. 1F, the filler 120 in the hole 115 is removed to form a through hole 124 that penetrates through the substrate. Various suitable techniques can be used for removing the filler 120. For example, the filler 120 can be removed by using an isotropic etching process. More particularly, considering the fact that the material of the filler 120 is a semiconductor material such as silicon, the filler 120 can be removed by dry etching using a fluorine-contained gas or by wet etching using an alkaline solution. The alkaline solution can be, for example, concentrated ammonia solution, KOH solution, tetramethylammonium hydroxide (TMAH) solution, or the like. Different from the situation where an acid solution is generally used for etching silicon oxide or silicon nitride that serves as TSV dummy material, using an alkaline solution can easily remove the semiconductor material that forms the filler 120 while the metal plug 220 on the filler 120 and the isolation layer 130 around the filler 120 are almost without damage because such etching method has a high selectivity. Therefore, using a semiconductor material as a TSV dummy material can advantageously protect the metal plug 220 from damage during the process of removing the filler 120.

In addition, optionally, if the compound 140 has been formed on the filler 120 as described above with reference to FIG. 1D, during the process of removing the filler 120, the compound 140 can further protect the metal plug 220 that is above the filler 120 from being etched.

Figure 1G:
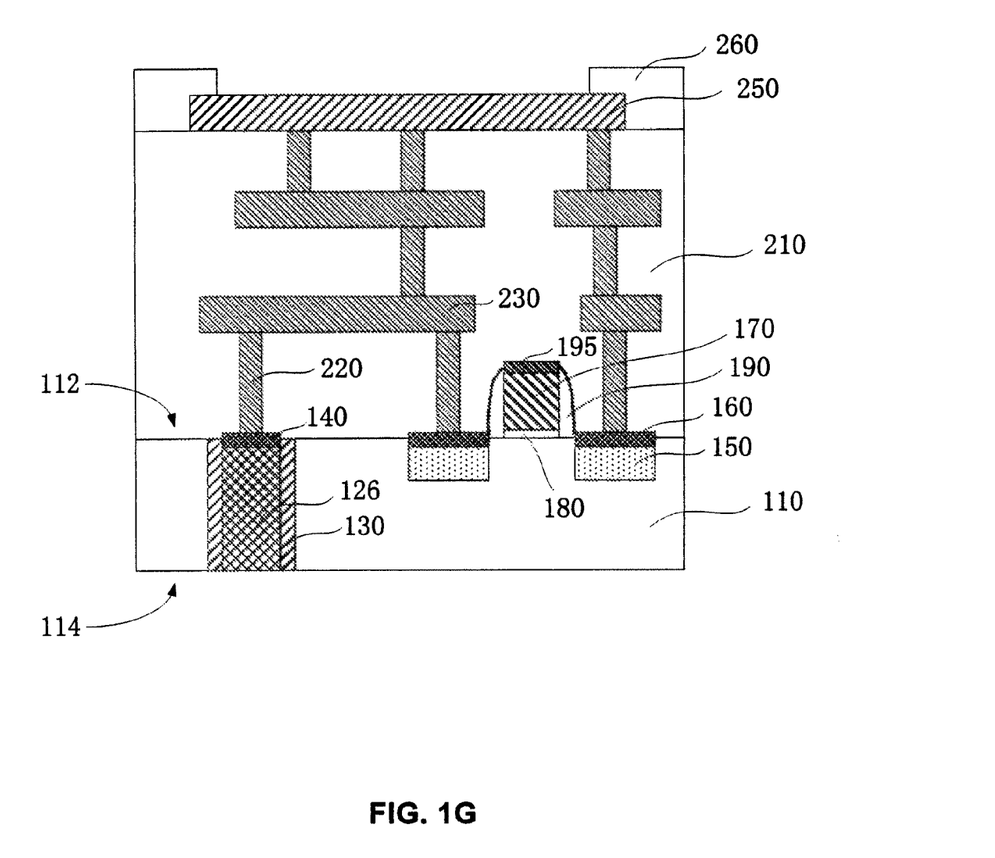

Then, as shown in FIG. 1G, through hole 124 is filled with a conductive material, thereby obtaining a conductive via 126 that passes through the substrate. The conductive material is preferably a metal, such as copper. Various known techniques can be used for filling the through hole 124, and the details thereof will not be described here. As such, a semiconductor device having TSV can be obtained, wherein the TSV is filled with a conductive material such as copper.

It can be known from the above discussion that, using the method according to the aforementioned embodiment of the present invention to form TSV can avoid the problem of incompatibility with subsequent processes that occur when using dielectric materials such as silicon oxide or silicon nitride as TSV dummy materials.

An exemplary specific method of forming a filler of semiconductor material within a hole in a substrate is described below with reference to FIGS. 2A-2E. The structure shown in FIG. 1C can be obtained using this method.

Figure 2A:
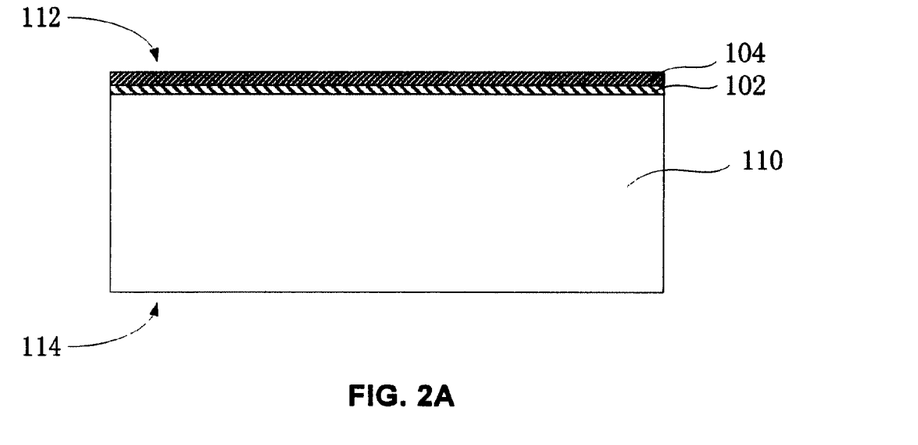
FIGS. 2A-2F are schematic cross-sectional views showing corresponding structures in each step of an exemplary method for forming a semiconductor material filler in a hole of a substrate, according to a specific example of the present invention.

Firstly, as shown in FIG. 2A, a pad oxide layer 102 and a silicon nitride layer 104 are formed in turn on the first side 112 of the substrate 110. Optionally, an oxide hard mask layer (not shown) can be formed on the silicon nitride layer 104 so as to serve as a mask in the formation of the hole 115 in the substrate 110.

Figure 2B:
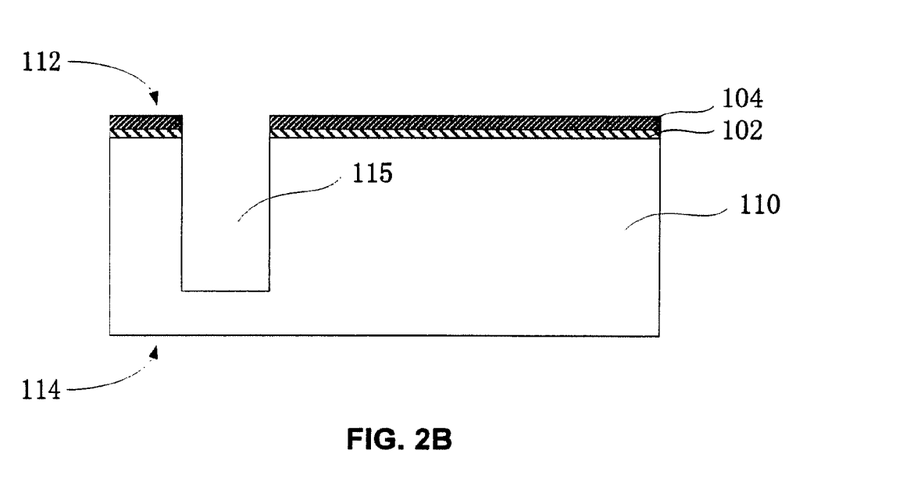

Then, as shown in FIG. 2B, a portion of the silicon nitride layer 104, the pad oxide layer 102 and the substrate 110 are etched from the first side 112, thereby forming the hole 115.

Figure 2C:
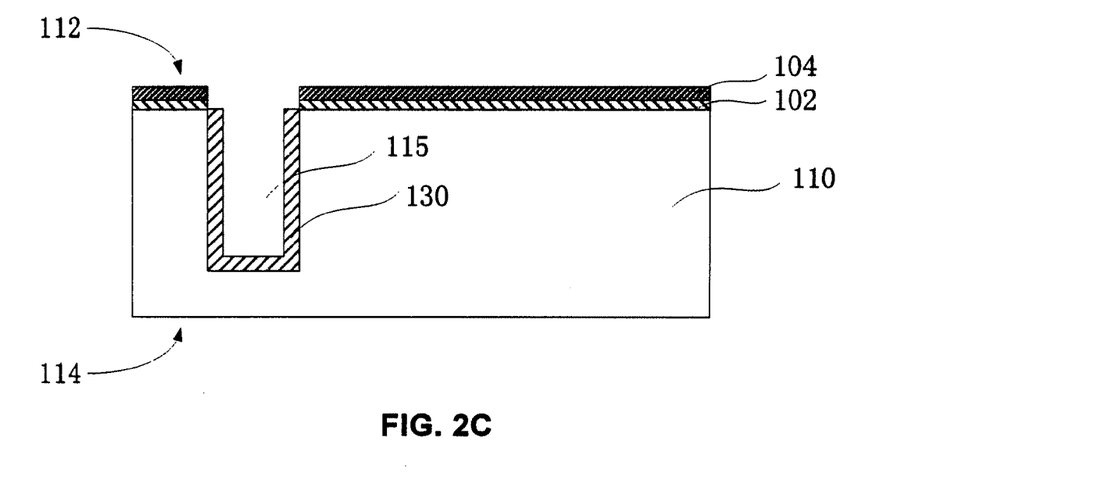

Next, as shown in FIG. 2C, an oxidation process is performed for the substrate 110 walls of the hole 115 so as to form an oxide isolation layer 130 on the inner sides of the hole 115.

Figure 2D:
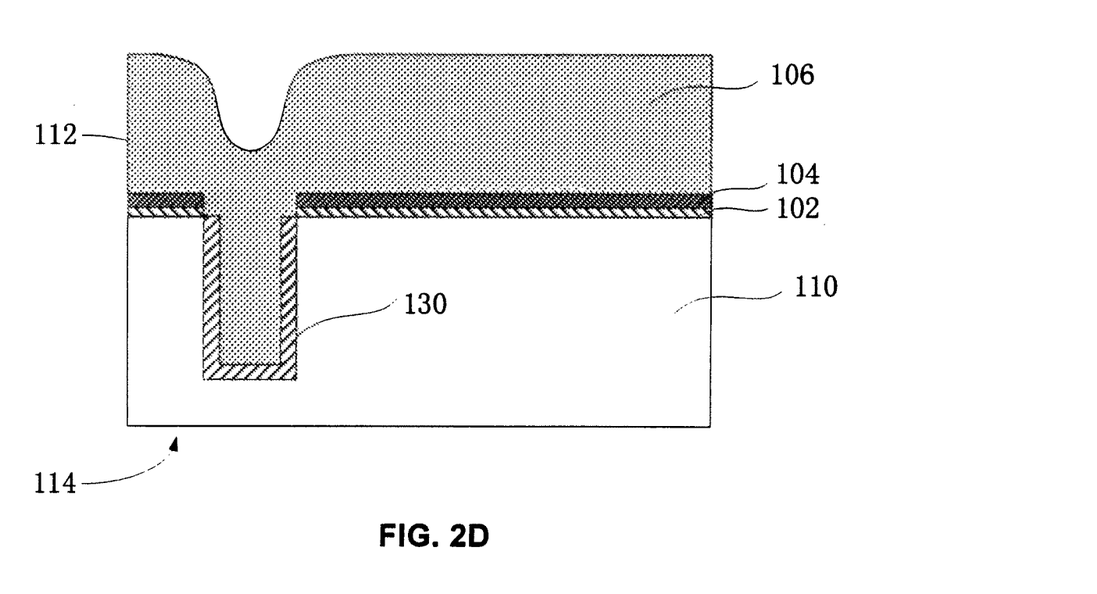

Then, as shown in FIG. 2D, the semiconductor material 106, such as silicon, is deposited in the hole 115 and on the silicon nitride layer 104.

Figure 2E:
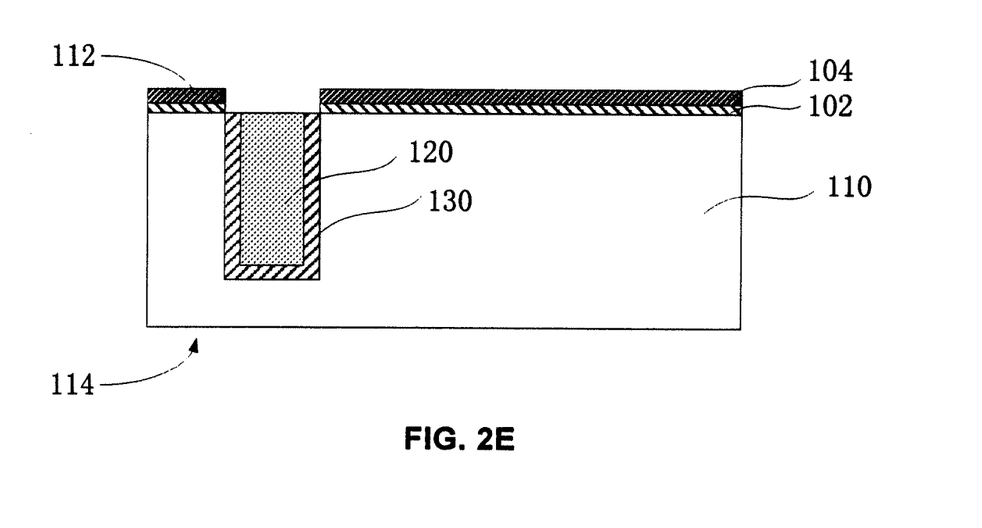

Next, as shown in FIG. 2E, a chemical mechanical polishing (CMP) is conducted to expose the silicon nitride layer 104. The semiconductor material in the hole 115 is maintained to form the filler 120. Generally, the upper surface of the filler 120 may be slightly lower than the silicon nitride layer 104, due to over-polishing or the like during the CMP process. In practice, the resulting filler 120 may be slightly higher than or substantially flush with the upper surface of the substrate 110. One of ordinary skill in the relevant art can readily understand that in either case, the implementation of the present invention will not be affected, nor will the subsequent steps.

Figure 2F:
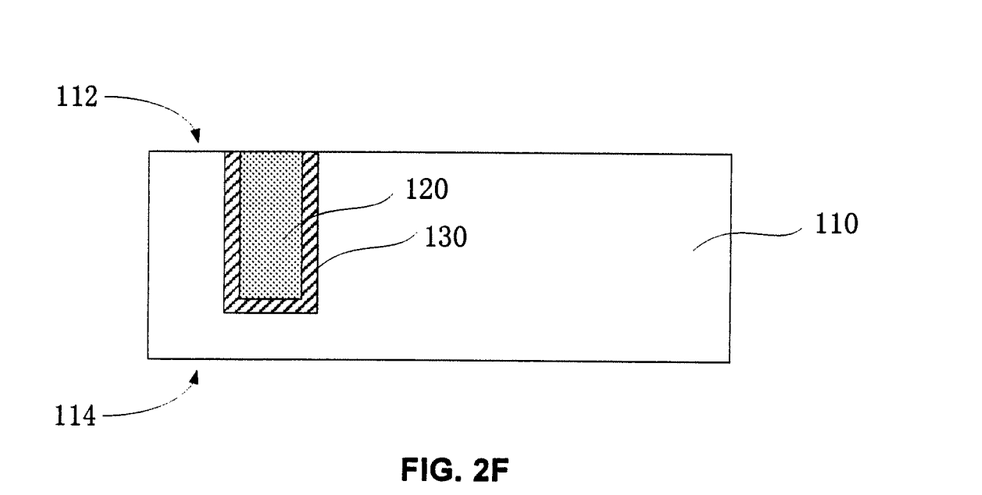

Next, as shown in FIG. 2F, after removing the silicon nitride layer 104 and the pad oxide layer 102 on the substrate 110, the substrate 110 and a hole having the isolation layer 130 and the semiconductor material filler 120 can be obtained. Various known techniques (such as wet etching) can be used for removing the silicon nitride layer 104 and the pad oxide layer 102, and the details will not be described here. The structure shown in FIG. 2F is similar to that shown in FIG. 1C.

After obtaining the structure shown in FIG. 2F, steps as shown in FIGS. 1D-1G can proceed, so as to obtain a semiconductor device having TSV.

Figure 3:
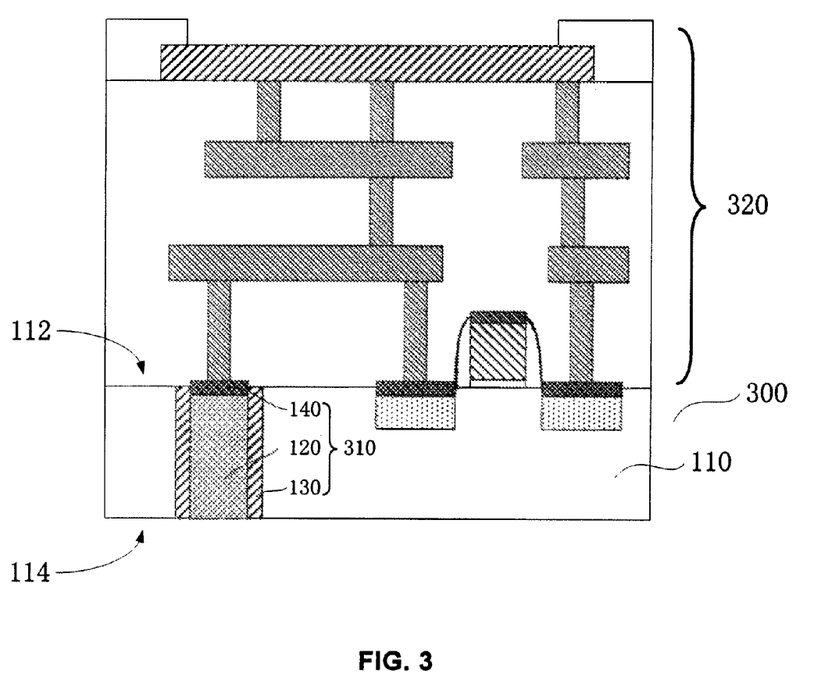
FIG. 3 is a structural diagram showing a semiconductor device according to an embodiment of the present invention.

FIG. 3 is a structural diagram showing a semiconductor device 300 according to an embodiment of the present invention.

As shown in FIG. 3, the semiconductor device 300 can include a substrate 110 and a via 310 that passes through the substrate. The substrate 110 can be formed of various suitable semiconductor materials, including but not limited to, silicon, germanium, SiGe, or the like. The substrate 110 has a first side 112 and a second side 114 opposite to the first side 112.

One or more functional structures 320 can be formed on the first side 112. As an example, FIG. 3 shows functional structures that can be formed on the first side 112 of the substrate 110, which can include a MOS transistor, metal interconnects, metal plugs, a passivation layer, or the like. However, the functional structure is not limited to these, but can be any structure that can be formed on the substrate and have certain functionality. The via 310 has an isolation layer 130 formed on its inner sides and is filled with a semiconductor material 120. A compound 140 is formed by reacting a metal and the semiconductor material 120 at an end of the via 310 that is close to the first side 112. The semiconductor material 120 can be silicon, germanium, SiGe, or the like. The metal forming the compound 140 can be nickel, cobalt, titanium, or the like.

Figure 4:
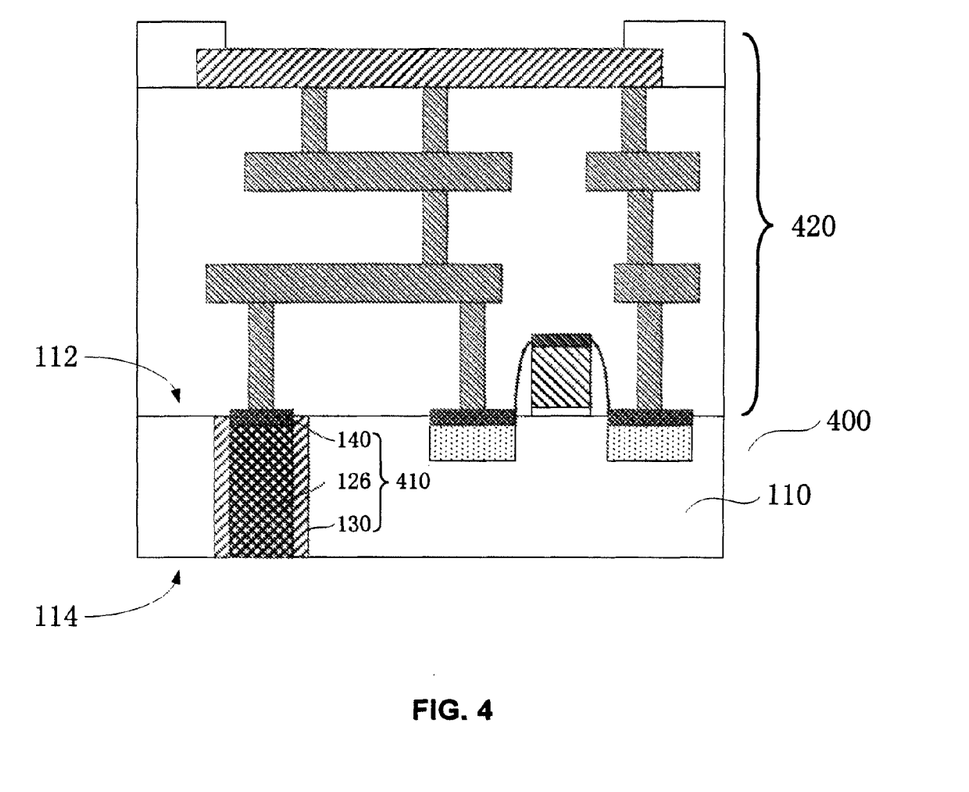
FIG. 4 is a structural diagram showing a semiconductor device according to another embodiment of the present invention.

FIG. 4 is a structural diagram showing a semiconductor device 400 according to another embodiment of the present invention.

As shown in FIG. 4, semiconductor device 400 can include a substrate 110 and a via 410 that passes through the substrate. The substrate 110 can be formed of various suitable semiconductor materials, including but not limited to, silicon, germanium, SiGe, or the like. The substrate 110 has a first side 112 and a second side 114 opposite to the first side 112. One or more functional structures 420 can be formed on the first side 112. As an example, FIG. 4 shows functional structures that can be formed on the first side 112 of the substrate 110, which can include a MOS transistor, metal interconnects, metal plugs, a passivation layer, or the like. However, the functional structure is not limited to these, but can be any structure that can be formed on the substrate and have certain functionality. The via 410 has an isolation layer 130 formed on its inner side and is filled with a conductive material 126. A compound 140 is formed by reacting a metal and a semiconductor material at an end of the via 410 that is close to the first side 112. The conductive material 126 can be various metals, such as copper. The semiconductor material forming the compound 140 can be silicon, germanium, SiGe, or the like. The metal forming the compound 140 can be nickel, cobalt, titanium, or the like. Electrical connections between different chips can be easily established by using the through substrate via 410.

A method for manufacturing a semiconductor device according to the present invention as well as a semiconductor device formed thereby has been described in detail above. In order not to obscure the concepts of the present invention, some details that are well-known in the art are not described. One of ordinary skill in the art can totally understand how to implement the technical solutions disclosed herein based on the above descriptions.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A method for manufacturing a semiconductor device, comprising:
    forming a pad oxide layer and a silicon nitride layer in turn on a first side of a substrate;
    forming a hole in the first side of the substrate;
    forming an isolation layer on the inner sides of the hole;
    filling the hole with a semiconductor material;

forming one or more functional structures on the first side of the substrate;

thinning the substrate from a second side opposite to the first side of the substrate, so as to expose the semiconductor material in the hole;

removing the semiconductor material to form a through hole penetrating through the substrate; and filling the through hole with a conductive material.

2. The method according to claim 1, wherein forming one or more functional structures on the first side of the substrate comprises:

forming a compound by reacting the semiconductor material and a metal on the semiconductor material.

3. The method according to claim 2, wherein the metal is nickel, cobalt, or titanium.

4. The method according to claim 1, wherein the semiconductor material is silicon, germanium, or SiGe.

5. The method according to claim 1, wherein the semiconductor material is poly-silicon.

6. The method according to claim 1, wherein the semiconductor material is n-type or p-type doped silicon.

7. The method according to claim 1, wherein forming the isolation layer comprises:

performing an oxidation process to form an oxide isolation layer on the inner sides of the hole.

8. The method according to claim 1, wherein filling the hole with the semiconductor material comprises:

depositing the semiconductor material in the hole and on the silicon nitride layer;

performing a chemical mechanical polishing (CMP) so as to expose the silicon nitride layer; and removing the silicon nitride layer and the pad oxide layer.

9. The method according to claim 1, wherein the hole has a depth ranging from 5 μm to 40 μm.

10. The method according to claim 1, wherein the isolation layer has a thickness ranging from 50 Å to 2000 Å.

11. The method according to claim 1, wherein the conductive material is copper.

12. The method according to claim 1, wherein the functional structures comprise a MOS transistor.

13. The method according to claim 1, wherein removing the semiconductor material comprises:

using an isotropic etching process.

14. The method according to claim 13, wherein the semiconductor material is removed by dry etching using a fluorine-containing gas.

15. The method according to claim 13, wherein the semiconductor material is removed by wet etching using an alkaline solution.

16. The method according to claim 15, wherein the alkaline solution is concentrated ammonia solution, KOH solution, or tetramethylammonium hydroxide (TMAH) solution.

* * * * *